United States Patent [19]

Kelly et al.

[11] Patent Number: 5,127,026
[45] Date of Patent: Jun. 30, 1992

[54] CIRCUIT AND METHOD FOR EXTRACTING CLOCK SIGNAL FROM A SERIAL DATA STREAM

[75] Inventors: Richard J. Kelly, Santa Clara; Andrew C. Graham, Sunnyvale; Dung Q. Tran, San Jose, all of Calif.

[73] Assignee: Gazelle Microcircuits, Inc., Santa Clara, Calif.

[21] Appl. No.: 505,857

[22] Filed: Apr. 5, 1990

[51] Int. Cl.⁵ .............................. H04L 7/00
[52] U.S. Cl. ...................... 375/106; 370/105.5
[58] Field of Search ......... 375/94, 95, 106, 111, 375/113, 116, 117; 328/63, 72; 307/269; 370/100.1, 105.5

[56] References Cited

U.S. PATENT DOCUMENTS

| | | | |
|---|---|---|---|
| 3,663,883 | 5/1972 | Olso | 328/72 |
| 3,684,967 | 8/1972 | Kelly | 328/63 |
| 3,825,844 | 7/1974 | Peterman et al. | 328/63 |
| 3,961,138 | 6/1976 | Fellinger | 375/95 |
| 4,242,755 | 12/1980 | Gavzan | 375/116 |
| 4,606,050 | 8/1986 | Sekigawa et al. | 375/95 |
| 4,797,678 | 1/1989 | Tsuji et al. | 375/95 |

Primary Examiner—Stephen Chin
Attorney, Agent, or Firm—Skjerven, Morrill, MacPherson, Franklin & Friel

[57] ABSTRACT

In accordance with the invention, a circuit and a method for extracting a clock signal from a serial data stream are provided. A window pulse is generated such that transitions of a delayed version of the serial data stream occur near the center of the window pulse. A PUP signal and a PDN signal are generated having pulse widths indicative of the time at which transitions of the clock signal occur with respect to the window pulse. The PUP and PDN signals are used to generate a reference voltage to control the clock frequency. Window pulses may be generated in response to only positive transitions or to only negative transitions of the delayed serial data stream, or alternatively may be generated in response to both negative and positive transistions. The amount of delay introduced to the serial data stream may be selectively adjusted for different bit rates.

20 Claims, 5 Drawing Sheets

CIRCUIT AND METHOD FOR EXTRACTING CLOCK SIGNAL FROM A SERIAL DATA STREAM

CROSS-REFERENCE TO RELATED APPLICATIONS

The following co-pending applications are assigned to the same assignee of the present application and are related to the present application:

a. "Current Pump Structure" by Mark E. Fitzpatrick et al., filed concurrently herewith and assigned Ser. No. 07/506,418;

b. "Floating FET Switch" by Mark E. Fitzpatrick et al., filed concurrently herewith and assigned Ser. No. 07/505,856;

c. "Phase-Locked Loop With Clamped Voltage-Controlled Oscillator" by Andrew C. Graham et al., filed concurrently herewith and assigned Ser. No. 07/505,851;

d. "Translator Circuit For Converting ECL Type Signals to TTL Type Signals" by Mark Fitzpatrick et al., filed concurrently herewith and assigned Ser. No. 07/505,852;

e. "Phase Detector Implemented With Diode Logic" by Mark Fitzpatrick et al., filed concurrently herewith and assigned Ser. No. 07/505,376.

The disclosures of these concurrently filed applications are incorporated herein by reference.

BACKGROUND OF THE INVENTION

1. Field of the Invention

The invention relates to data communications apparatus and more particularly to a circuit and a method for extracting a clock signal from a serial data stream.

2. Description of the Relevant Art

Data communication between digital systems is typically achieved by converting parallel data to serial data at a transmitting port, sending the serial data in a stream through a transmission medium to a receiving port, and reconverting the serial data stream to parallel data at the receiving port. The parallel-to-serial conversion is required since many common carriers, such as modems and telephone lines, are limited to serial transmission.

A major consideration involved with the data communication is synchronization of the serial-to-parallel conversion at the receiving port. The serial data stream must be sampled at the proper time and rate to assure accurate serial-to-parallel conversion.

An internal clock of the receiving port typically controls the sampling of the serial data stream, and hence, the phase and frequency of this internal clock must be synchronized with the incoming data stream. Many systems have been designed wherein a phase-locked loop circuit is utilized to lock the internal clock signal to the serial data stream. Other systems have been proposed wherein control bits are inserted within the serial data stream at the transmitting port. The control bits consequently provide "time markers" to trigger the internal clock. In either case, such prior art systems are often limited to low transmission frequencies or are associated with a high cost.

SUMMARY OF THE INVENTION

In accordance with the invention, a circuit and a method for extracting a clock signal from a serial data stream are provided. A window pulse is generated such that transitions of a delayed version of the serial data stream occur near the center of the window pulse. A PUP signal and a PDN signal are generated having pulse widths indicative of the time at which transitions of the clock signal occur with respect to the window pulse. The PUP and PDN signals are used to generate a reference voltage to control the clock frequency and phase.

The circuit for extracting a clock signal from a serial data stream comprises a means for generating a window pulse, a means for delaying the serial data stream and for centering transitions of the delayed serial data stream near the center of the window pulse, and means for generating at least one signal indicative of the time at which transitions of the clock signal occur with respect to the center of the window pulse for controlling the frequency of the clock signal.

The method for extracting a clock signal from a serial data stream comprises the steps of generating a window pulse, delaying the serial data stream and centering transitions of the delayed serial data stream near the center of the window pulse, and generating at least one signal indicative of the time at which transitions of the clock signal occur with respect to the center of the window pulse for controlling the frequency of the clock signal.

In one embodiment of the invention, the means for generating a window pulse includes an AND gate and the delaying and centering means includes a pair of delay circuits. A window pulse is generated in response to each positive transition of the delayed serial data stream.

In a second embodiment of the invention, the means for generating a window pulse includes an exclusive OR gate and the delaying and centering means includes a pair of delay circuits. A window pulse is generated in response to each positive and negative transition of the delayed serial data stream.

To accommodate operation of the invention for serial data streams having different bit rates, a combination of the first and second embodiments is further provided which allows window pulses to be generated in response to only positive transitions (or to only negative transitions), or in response to both positive and negative transitions of the delayed serial data stream depending upon a selecting signal.

The delaying means may also be configured to selectively provide a different amount of delay depending upon a control signal to further accommodate operation of the invention for serial data streams having different bit rates. The amount of delay may be selected by an externally supplied control signal or by a control signal indicative of the frequency of the clock signal.

The invention will be more readily understood by reference to the drawings and the detailed description. As will be appreciated by one skilled in the art, the invention is applicable to circuits for extracting a clock signal from a serial data stream in general, and is not limited to the specific embodiments disclosed.

DETAILED DESCRIPTION

Figure 1:
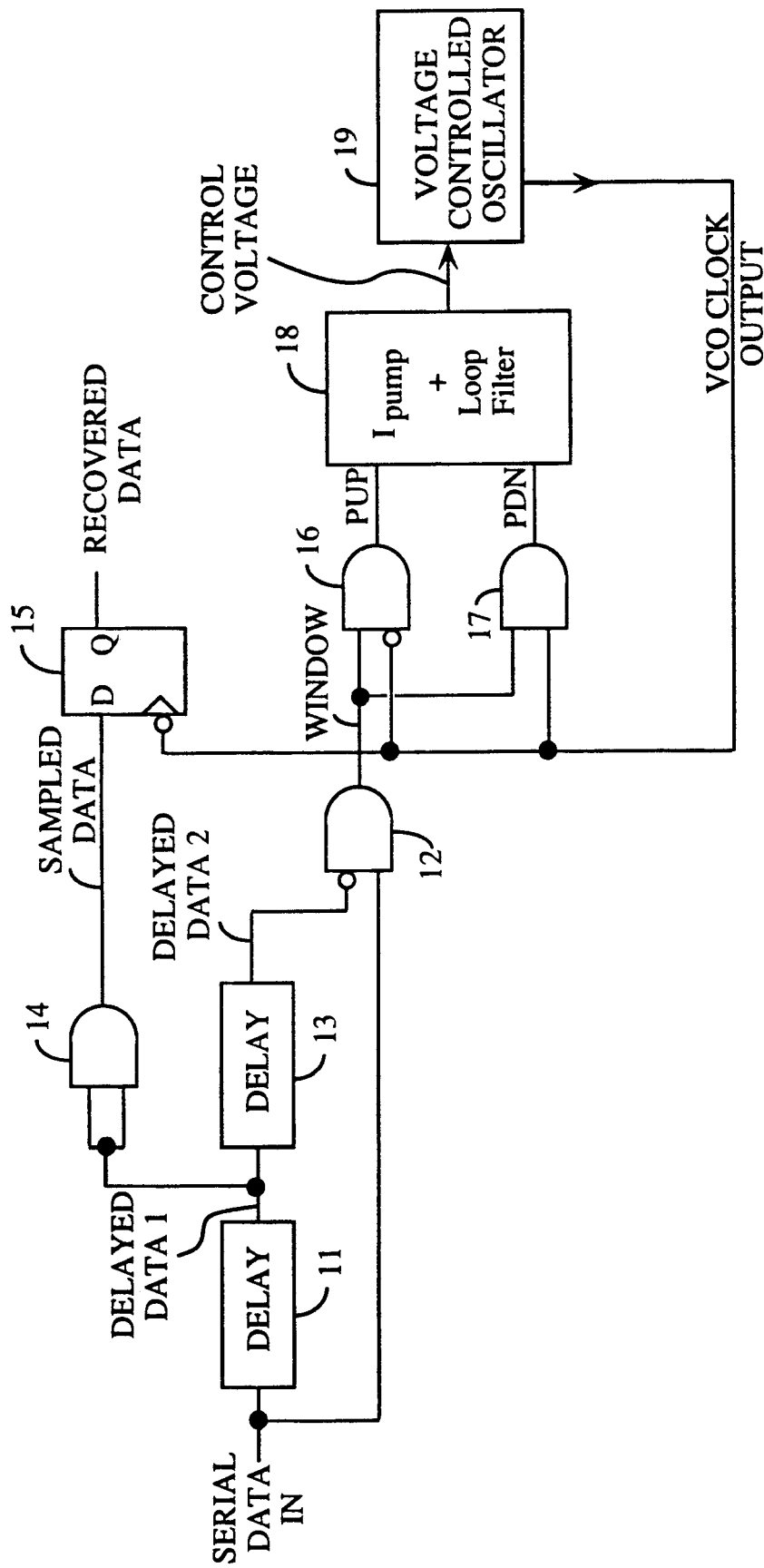
FIG. 1 shows a block diagram of a circuit for extracting a clock signal from a serial data stream in accordance with the invention.

Referring to FIG. 1, a circuit for extracting a clock signal from a serial data stream in accordance with the invention is shown. An input line labelled SERIAL DATA IN is connected to a delay circuit 11 and to an AND gate 12. A line labelled DELAYED DATA 1 from delay circuit 11 is connected to a second delay circuit 13 and to a pair of input lines of an AND gate 14. A line labelled DELAYED DATA 2 from delay circuit 13 is connected to an inverting input line of AND gate 12. A line labelled SAMPLED DATA from AND gate 14 is connected to a flip-flop 15, and a line labelled WINDOW from AND gate 12 is connected to AND gates 16 and 17.

AND gates 16 and 17 function as a phase detector and may be configured (but not limited to) in a manner specified in the co-pending and related application titled "Phase Detector Implemented With Diode Logic" by Mark Fitzpatrick et al. In addition, if it is necessary to convert the WINDOW and VCO clock signals from differential to single-ended, a circuit as specified in the co-pending and related application titled "Translator Circuit For Converting ECL Type Signals to TTL Type Signals" by Mark Fitzpatrick et al. may be used.

Output lines from AND gates 16 and 17 labelled PUP and PDN respectively are connected to an integrator/loop filter circuit 18. Integrator/loop filter circuit 18 is further connected to the CONTROL VOLTAGE line of a voltage controlled oscillator 19. A VCO CLOCK OUTPUT line from voltage controlled oscillator 19 is connected to AND gates 16 and 17 and to an inverting clock input line of flip-flop 15. Finally, a line labelled RECOVERED DATA is connected to the output terminal of flip-flop 15.

Figure 2:
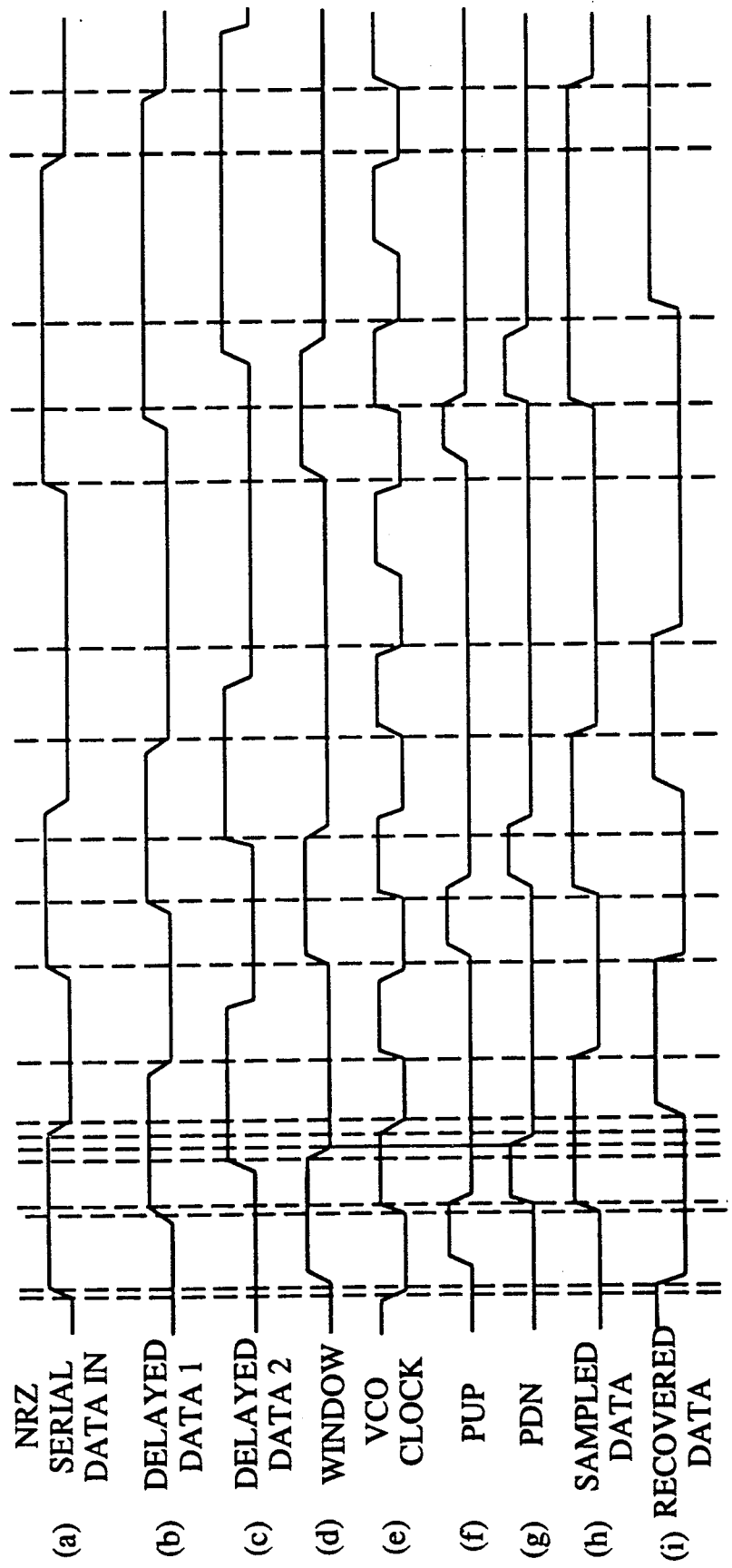
FIG. 2 shows timing waveforms which illustrate operation of the circuit of FIG. 1.

Referring next to the waveforms of FIGS. 2(a)-2(i) in conjunction with FIG. 1, operation of the clock extraction circuit is explained as follows. A serial data stream is received at the SERIAL DATA IN line. When a serial data stream as exemplified in FIG. 2(a) is received at the SERIAL DATA IN line, it propagates through and is delayed by delay circuits 11 and 13. Delay circuits 11 and 13 cause an equal time delay, and thus the waveforms as shown in FIGS. 2(b) and 2(c) appear at the DELAYED DATA 1 and DELAYED DATA 2 lines respectively. A corresponding signal at the WINDOW line is generated by AND gate 12 as shown in FIG. 2(d). It should be noted the WINDOW signal is delayed slightly due to the propagation delay of AND gate 12.

A VCO clock signal at the VCO CLOCK OUTPUT line of voltage controlled oscillator 19 is shown in FIG. 2(e). The VCO clock signal is assumed for explanation purposes to have the initial phase and frequency as shown. In response to the VCO clock signal and the WINDOW signal, a signal at the PUP line as shown in FIG. 2(f) is generated by AND gate 16 and a signal at the PDN line as shown in FIG. 2(g) is generated by AND gate 17. It should be noted that the PUP and PDN signals as shown in FIG. 2(g) are delayed slightly due to the propagation delays of AND gates 16 and 17.

The VCO clock signal is also received at an inverting clock line of flip-flop 15. The DELAYED DATA 1 signal propagates through AND gate 14 which introduces an associated delay and results in the SAMPLED DATA signal of FIG. 2(h). Flip-flop 15 latches the SAMPLED DATA signal to its output line on each falling edge of the VCO clock signal. A RECOVERED DATA signal as shown in FIG. 2(i) is consequently provided at the RECOVERED DATA line.

It is apparent that AND gate 14 introduces a delay which matches the delay of AND gate 12. The timing of the SAMPLED DATA signal is therefore refined to ensure proper operation. It is possible, however, that the circuit may operate satisfactorily in many situations without AND gate 14 and that the scope of the invention is not limited thereby.

Integrator/loop filter circuit 18 provides a control voltage which determines the frequency of the VCO clock signal from voltage controlled oscillator 19. Integrator/loop filter circuit 18 may be implemented as described in the co-pending and related application titled "Current Pump Structure" by Gary Gouldsberry et al. The PUP signal causes integrator/loop filter circuit 18 to integrate the control voltage positively by an amount proportional to its pulse width. The PDN signal causes integrator/loop filter circuit 18 to integrate the control voltage negatively by an amount proportional to its pulse width. Since the pulse widths of the PUP and PDN signals shown in FIGS. 2(f) and 2(g) are equal, the control voltage remains unchanged from its prior value. Therefore, the frequency of the VCO clock signal also remains constant. When it is necessary to set the center frequency of the VCO to a given frequency, a circuit may be used as described in the co-pending and related application titled "Phase-Locked Loop With Clamped Voltage-Controlled Oscillator" by Andrew C. Graham et al.

The WINDOW signal is driven HIGH slightly after the SERIAL DATA IN signal goes HIGH. (The slight delay is introduced by AND gate 12.) The WINDOW signal remains HIGH until slightly after the DELAYED DATA 2 signal goes HIGH, thus forming a WINDOW pulse. It should be noted that the rising edge of the SAMPLED DATA signal occurs at the center of the WINDOW pulse.

The PUP and PDN signals control integrator/loop filter circuit 18 such that voltage controlled oscillator 19 maintains a VCO clock signal having positive transitions at the center of the WINDOW pulse. Since the positive transitions of the SAMPLED DATA signal also occur at the center of the WINDOW pulse, and since flip-flop 15 is triggered by each negative transition of the VCO clock signal, the SAMPLED DATA signal is sampled at the center of each data bit. The resulting RECOVERED DATA signal is thus synchronized with the VCO clock signal, and parallel conversion can be readily and accurately performed using, for example, shift registers.

The PUP and PDN signals maintain the synchronization of the VCO clock signal and RECOVERED DATA signal. If the positive transition of the VCO clock signal is offset from the center of the WINDOW pulse, the pulse widths of the PUP and PDN signals become unequal and thus cause the control voltage to raise or lower depending upon which signal has the greater pulse width. The frequency of the VCO clock signal in response increases or decreases. This feedback process is repeated upon consecutive cycles to actively position the positive transitions of the VCO clock to the center of the WINDOW pulse.

The pulse widths of the PUP and PDN signals are proportional to the offset of the positive transitions of the VCO clock signal from the center of the WINDOW pulse. The PUP and PDN signals correspondingly dictate the frequency of the VCO clock signal in order to align the positive transition to the center of the WINDOW pulse. Since a WINDOW pulse is generated only upon the occurrence of a positive transition of the serial data stream, the frequency of the VCO clock signal is not affected when the serial data stream remains constant or goes LOW.

Variations of the circuit of FIG. 1 are possible without departing from the scope of the invention. For example, AND gate 12 may be configured to provide a WINDOW pulse in response to negative transitions of the DELAYED DATA 1 signal rather than in response to positive transitions.

Figure 3:
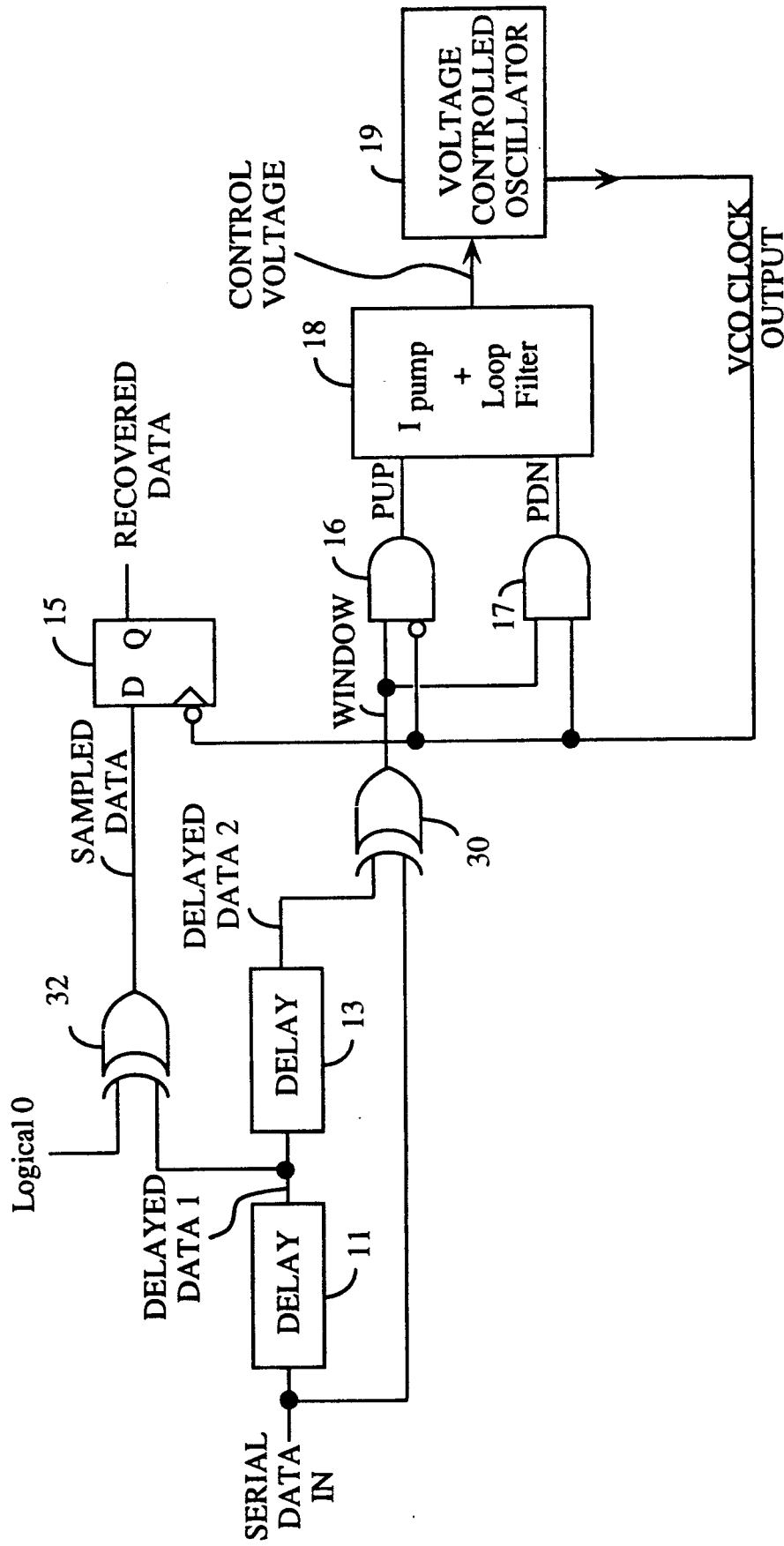
FIG. 3 shows a second embodiment of the circuit for extracting a clock signal from a serial data stream in accordance with the invention.

Referring next to FIG. 3, a second embodiment of the invention is shown. The circuit of FIG. 3 shows an exclusive OR gate 30 and an exclusive OR gate 31 connected in the place of AND gates 12 and 14 of FIG. 1. The other components shown in FIG. 3 are similar to and have the same numbering as the components of FIG. 1.

It is apparent that operation of the second embodiment is also similar to that of the first embodiment. However, since exclusive OR gate 30 is used, window pulses are generated during both positive and negative transitions of the DELAYED DATA 1 signal. As a consequence, since the PUP and PDN signals are generated for each WINDOW pulse, frequency adjustments of voltage controlled oscillator 19 may occur twice as often. Therefore, the VCO clock signal may align with the RECOVERED DATA signal in fewer bit cycles, and improved stability may result.

A disadvantage of the exclusive OR embodiment of FIG. 3 is that as the bit rate increases, the logic circuitry may be incapable of generating the PUP and PDN signals due to frequency limitations. In addition, integrator/loop filter 18 may not be responsive to the PUP and PDN signals at high frequencies. It therefore may be desirable to combine the embodiments of FIGS. 1 and 3 if serial data streams will be received having different bit rates.

Figure 4:
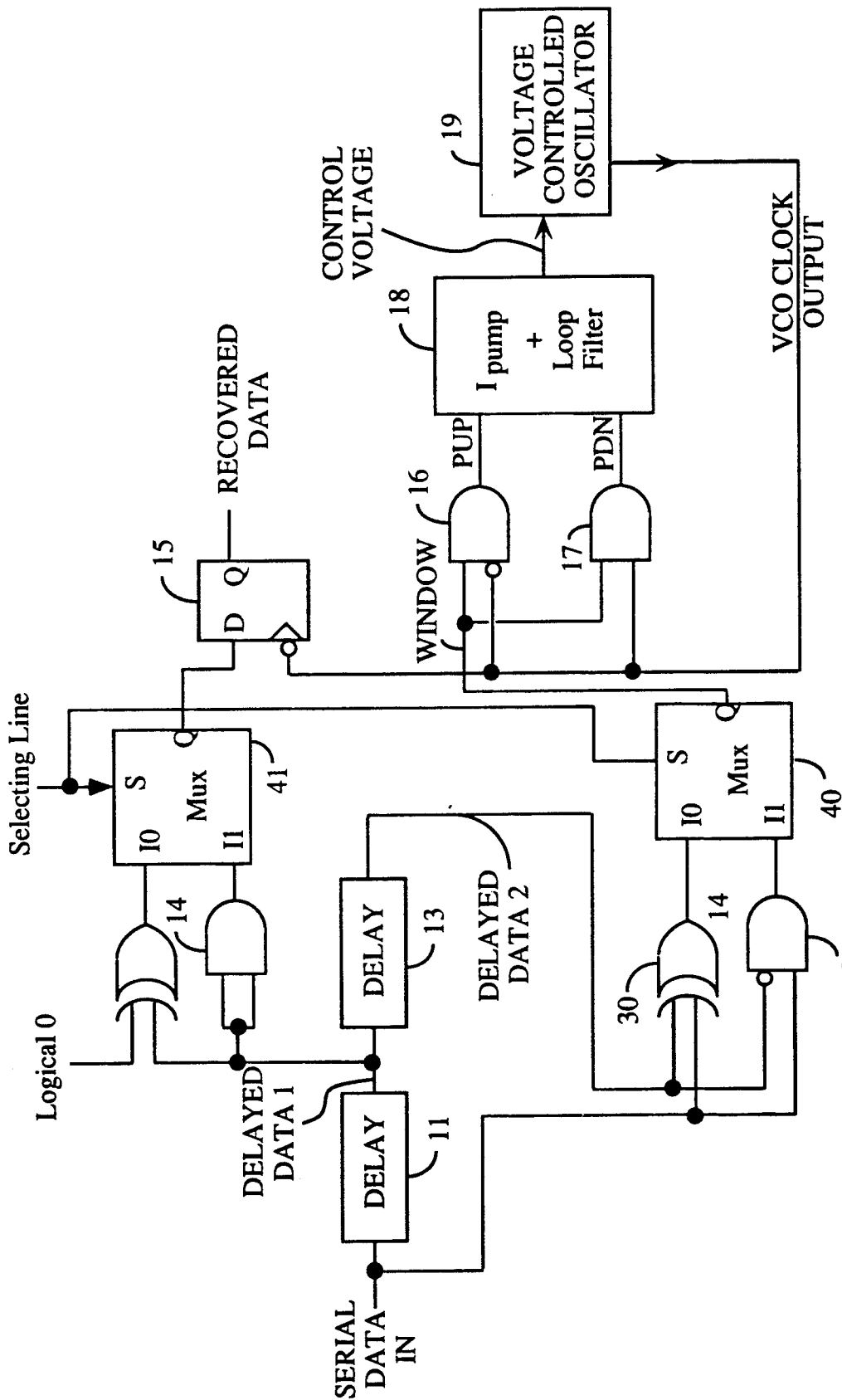
FIG. 4 shows a third embodiment of the circuit which is a combination of the first and second embodiments.

FIG. 4 shows a combined embodiment using both AND gate 12 and exclusive OR gate 30. A multiplexer 40 is connected to the output lines of AND gate 12 and exclusive OR gate 30. A selected WINDOW signal is consequently available at the output line of multiplexer 40. Depending upon the state of the selecting line of multiplexer 40, a WINDOW signal generated by either AND gate 12 or exclusive OR gate 30 is provided to AND gates 16 and 17.

A multiplexer 41 is further connected to AND gate 14 and exclusive OR gate 31. In this embodiment, the selecting line of multiplexer 41 is connected to the selecting line of multiplexer 40. The delay of either AND gate 14 or exclusive OR gate 31 is thus provided to the SAMPLED DATA signal in accordance with the state of the selecting line such that the delay of either AND gate 12 or exclusive OR gate 30, respectively, is matched.

Figure 5:
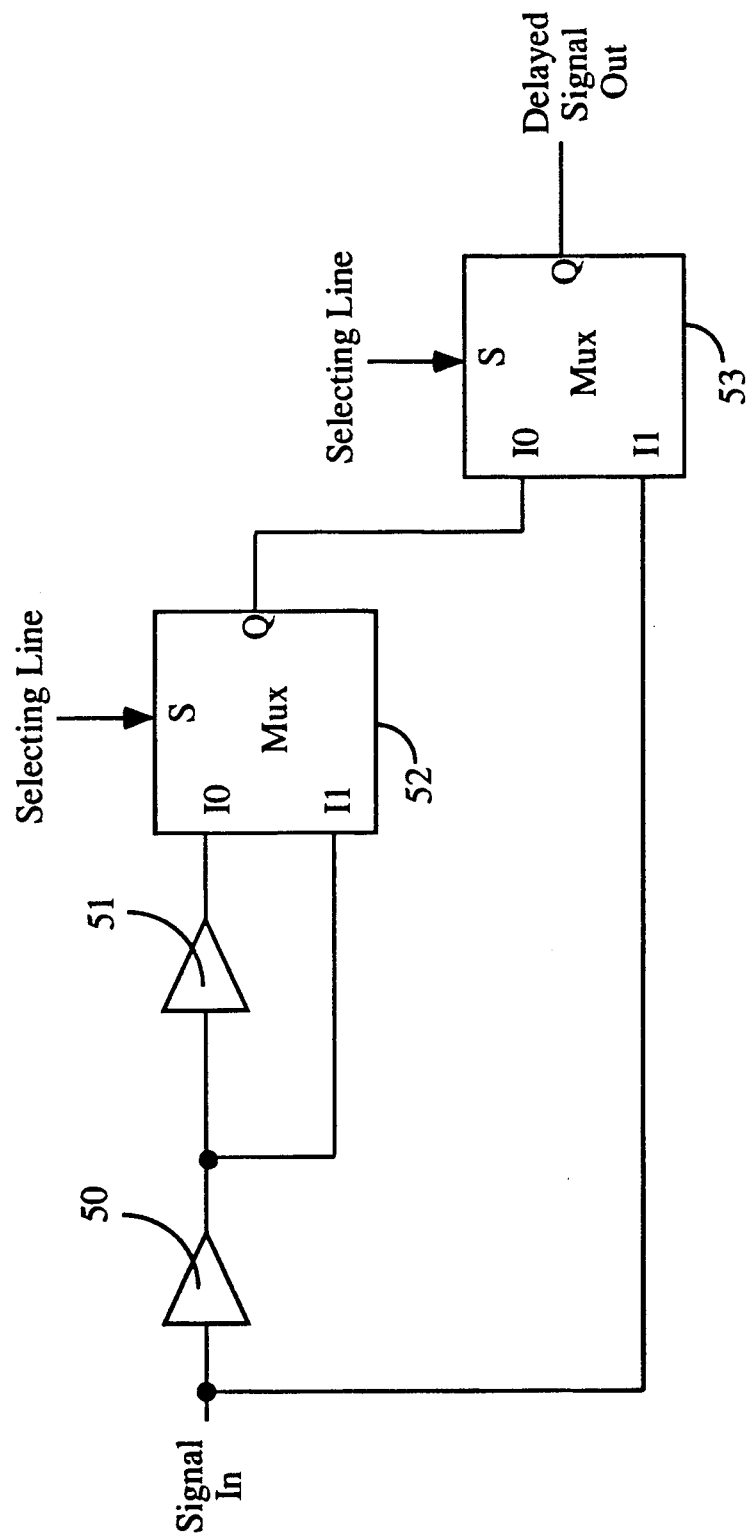
FIG. 5 shows a delay circuit having selective delays.

FIG. 5 shows a delay circuit which may be used to form delay circuits 11 and 13 shown in the earlier figures. The delay circuit of FIG. 5 includes buffers 50 and 51, and multiplexers 52 and 53. Each of buffers 50 and 51 and multiplexers 52 and 53 have an associated delay. Depending upon which lines of multiplexers 52 and 53 are selected, a predetermined signal delay is provided between the SIGNAL IN line and the DELAYED SIGNAL OUT line.

When the configuration as shown in FIG. 5 is implemented within delay circuits 11 and 13 of FIGS. 1, 3, or 4, the selected delay path required for each delay circuit depends upon the bit rate of the incoming serial data stream. In many cases, it is necessary for proper operation to decrease the delay of circuits 11 and 13 as the bit rate increases.

It is clear that the selecting lines of multiplexers 52 and 53 may be set by an externally supplied signal. It may alternatively be desirable to control the selecting lines of multiplexers 52 and 53 with a signal such as the control voltage from integrator/loop filter circuit 18. As such, when the control voltage varies between threshold levels, different delay paths are selected.

The circuits disclosed may be implemented using any transistor technology, such as bipolar or field effect technology, and may be implemented using any semiconductor technology, such as silicon or compound semiconductor technology.

The preferred embodiment of the present invention is constructed only of components commonly and currently available in GaAs or compound semiconductor technology. For example, in the preferred embodiment the invention does not depend on the use of insulated gate devices or other structures not easily manufacturable in GaAs.

The embodiments described above are intended to be exemplary and not limiting. In view of the above disclosure, modifications will be obvious to one of ordinary skill in the art without departing from the scope of the invention.

We claim:

1. A circuit comprising:
   a first generating means for generating a window pulse;
   a delaying and centering means for delaying a serial data stream and for centering transitions of the delayed serial data stream near the center of the window pulse, said delaying and centering means coupled to said first generating means;
   means for generating a clock signal; and
   a second generating means for generating at least one signal indicative of the time at which transitions of the clock signal occur with respect to the center of the window pulse for controlling the frequency of the clock signal, said second generating means coupled to said delaying and centering means and to said means for generating a clock signal.

2. The circuit according to claim 1 wherein said delaying and centering means comprises:
   a first delay circuit; and
   a second delay circuit coupled to said first delay circuit.

3. The circuit according to claim 2 wherein said first delay circuit comprises a first selective delay adjustment means that is selectively adjustable to provide different delay amounts, and wherein said second delay circuit comprises a second selective delay adjustment means that is selectively adjustable to provide different delay amounts.

4. The circuit of claim 3 wherein the delay of said first and second delay circuits is controlled by a signal indicative of the frequency of the clock signal.

5. The circuit according to claim 1 wherein said first generating means comprises an AND gate coupled to said delaying and centering means.

6. The circuit according to claim 1 wherein said first generating means comprises an exclusive OR gate coupled to said delaying and centering means.

7. The circuit according to claim 1 wherein said first generating means comprises:
    an AND gate coupled to said delaying and centering means;
    an exclusive OR gate coupled to said delaying and centering means; and
    selecting means coupled to said AND gate and to said OR gate, said selecting means for selecting a window pulse generated either by said AND gate or by said exclusive OR gate.

8. The circuit according to claim 1 further comprising a sampling means coupled to said delaying and centering means.

9. The circuit according to claim 8 wherein said sampling means includes a flip-flop.

10. The circuit according to claim 8 further comprising a second delay circuit coupled between said sampling means and said delaying and centering means.

11. The circuit according to claim 1 wherein said second generating means comprises:
    a first AND gate; and
    a second AND gate coupled to said first AND gate.

12. The circuit of claim 1 wherein said second generating means generates said at least one signal in response to positive transitions of the delayed serial data stream.

13. The circuit of claim 1 wherein said second generating means generates said at least one signal in response to both positive and negative transitions of the delayed serial data stream.

14. The circuit according to claim 1 wherein said second generating means generates a first signal for increasing the frequency of the clock signal and a second signal for decreasing the frequency of the clock signal.

15. A method for comprising the steps of:
    generating a window pulse;
    delaying a serial data stream and centering transitions of the delayed serial data stream near the center of the window pulse;
    generating a clock signal; and
    generating at least one signal indicative of the time at which transitions of the clock signal occur with respect to the center of the window pulse for controlling the frequency of the clock signal.

16. The method of claim 15 further comprising the step of selecting the delay amount introduced to the serial data stream.

17. The method of claim 15 further comprising the step of selecting the number of window pulses generated per bit cycle.

18. The circuit of claim 1 wherein said second generating means generates said at least one signal in response to said window pulse and to said clock signal.

19. The circuit according to claim 1 further comprising a sampling and storing means coupled to said delaying and centering means.

20. The circuit according to claim 8 wherein said sampling means provides an output signal representative of data embedded in said serial data stream.

* * * * *

UNITED STATES PATENT AND TRADEMARK OFFICE
CERTIFICATE OF CORRECTION

PATENT NO. : 5,127,026
DATED : June 30, 1992
INVENTOR(S) : Richard J. Kelly et al.

It is certified that error appears in the above-identified patent and that said Letters Patent is hereby corrected as shown below:

Column 8, line 8, delete "for".

Signed and Sealed this

Twenty-eighth Day of September, 1993

Attest:

BRUCE LEHMAN

Attesting Officer   Commissioner of Patents and Trademarks